(12) United States Patent
Wu et al.

(10) Patent No.: US 12,341,101 B2
(45) Date of Patent: Jun. 24, 2025

(54) METHOD FOR FORMING A SEMICONDUCTOR STRUCTURE BY DIFFUSING MANGANESE FROM A SEED LAYER TO A BARRIER LAYER

(71) Applicant: TAIWAN SEMICONDUCTOR MANUFACTURING COMPANY, LTD., Hsinchu (TW)

(72) Inventors: Cai-Ling Wu, Hsinchu (TW); Hsiu-Wen Hsueh, Taichung (TW); Chii-Ping Chen, Hsinchu (TW); Po-Hsiang Huang, Taipei (TW); Chi-Feng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 467 days.

(21) Appl. No.: 17/741,845

(22) Filed: May 11, 2022

(65) Prior Publication Data
US 2023/0369226 A1 Nov. 16, 2023

(51) Int. Cl.
*H01L 23/532* (2006.01)
*H01L 21/3105* (2006.01)
*H01L 21/762* (2006.01)
*H01L 21/768* (2006.01)

(52) U.S. Cl.
CPC .... *H01L 23/5329* (2013.01); *H01L 21/31055* (2013.01); *H01L 21/76224* (2013.01); *H01L 21/76843* (2013.01); *H01L 21/76858* (2013.01); *H01L 21/76864* (2013.01); *H01L 21/76868* (2013.01); *H01L 21/76871* (2013.01); *H01L 21/76882* (2013.01); *H01L 23/53209* (2013.01); *H01L 23/53238* (2013.01)

(58) Field of Classification Search
CPC ......... H01L 23/53223; H01L 23/53238; H01L 23/53252; H01L 23/53266; H01L 21/76843; H01L 21/76844; H01L 21/76846; H01L 21/76871–76876; H01L 21/76858; H01L 21/76868
See application file for complete search history.

(56) References Cited

U.S. PATENT DOCUMENTS

| | | | |
|---|---|---|---|
| 10,204,829 B1* | 2/2019 | Amanapu | H01L 21/76831 |
| 2010/0155951 A1* | 6/2010 | Koike | H01L 21/76864 |
| | | | 257/E23.161 |
| 2010/0320604 A1* | 12/2010 | Isobayashi | H01L 21/76805 |
| | | | 257/E23.142 |

(Continued)

*Primary Examiner* — Younes Boulghassoul
(74) *Attorney, Agent, or Firm* — Birch, Stewart, Kolasch & Birch, LLP

(57) ABSTRACT

A method for forming a semiconductor device structure is provided. The method includes removing a portion of a dielectric layer to form a trench in the dielectric layer. The method includes forming a barrier layer in the trench. The method includes forming a seed layer in the trench and over the barrier layer. The seed layer is doped with manganese. The method includes annealing the seed layer in a first process gas including a first hydrogen gas. A volume ratio of the first hydrogen gas to the first process gas ranges from about 50% to about 100%, and the manganese diffuses from the seed layer to the barrier layer during the annealing of the seed layer in the first process gas.

20 Claims, 19 Drawing Sheets

(56) References Cited

U.S. PATENT DOCUMENTS

| | | | |
|---|---|---|---|
| 2011/0017499 A1* | 1/2011 | Yang | H01L 21/76873 |
| | | | 174/257 |
| 2011/0024908 A1* | 2/2011 | Lee | H01L 23/53238 |
| | | | 257/E23.141 |
| 2012/0070981 A1* | 3/2012 | Clendenning | H01L 21/76867 |
| | | | 438/653 |
| 2014/0291847 A1* | 10/2014 | Zhang | H01L 21/76846 |
| | | | 438/653 |
| 2015/0111316 A1* | 4/2015 | Koschinsky | H01L 21/76868 |
| | | | 438/14 |
| 2015/0262870 A1* | 9/2015 | Lin | H01L 23/53238 |
| | | | 438/653 |
| 2015/0262938 A1* | 9/2015 | Lin | H01L 23/53295 |
| | | | 438/643 |
| 2017/0092589 A1* | 3/2017 | Chen | H01L 21/76873 |
| 2017/0236752 A1* | 8/2017 | Yu | H01L 21/76883 |
| | | | 438/653 |
| 2021/0159117 A1* | 5/2021 | Wang | H01L 21/76802 |
| 2023/0005789 A1* | 1/2023 | Parikh | H01L 21/76846 |
| 2023/0178487 A1* | 6/2023 | Hwang | H01L 23/53204 |
| | | | 257/750 |

* cited by examiner

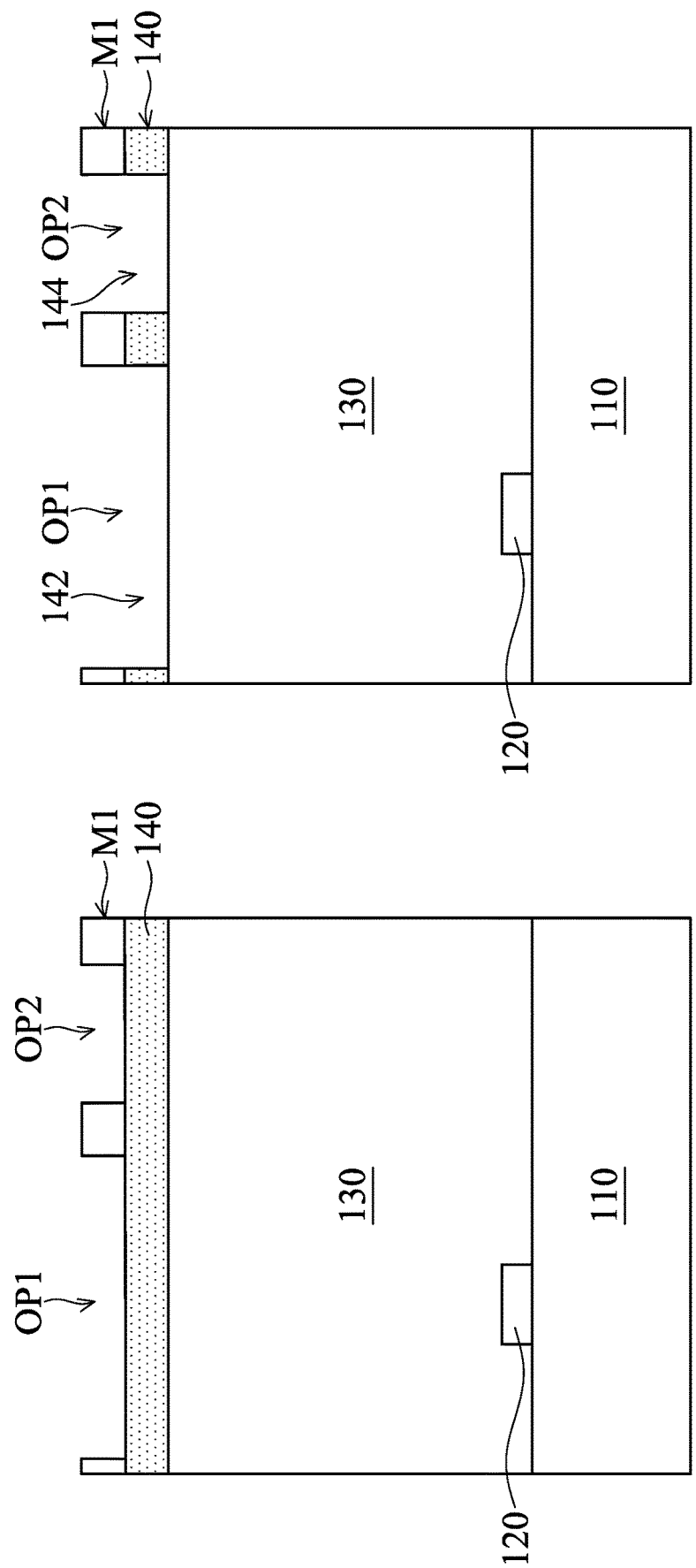

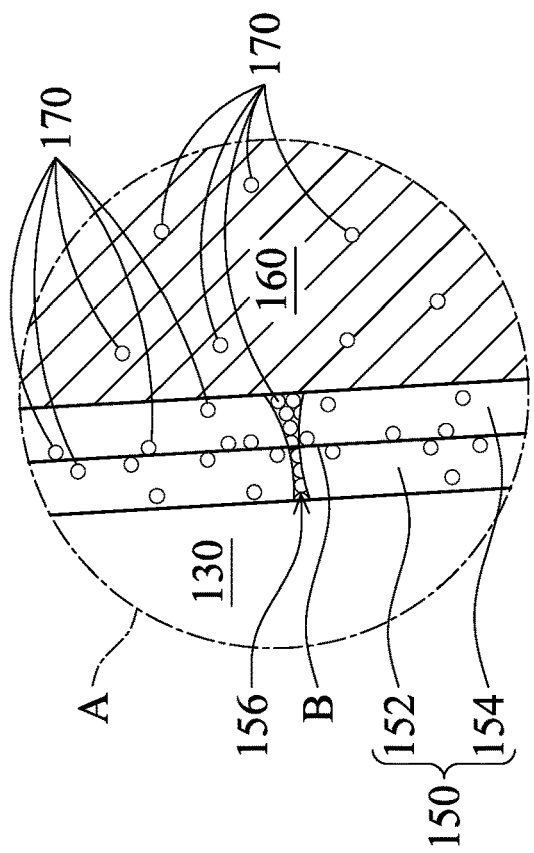
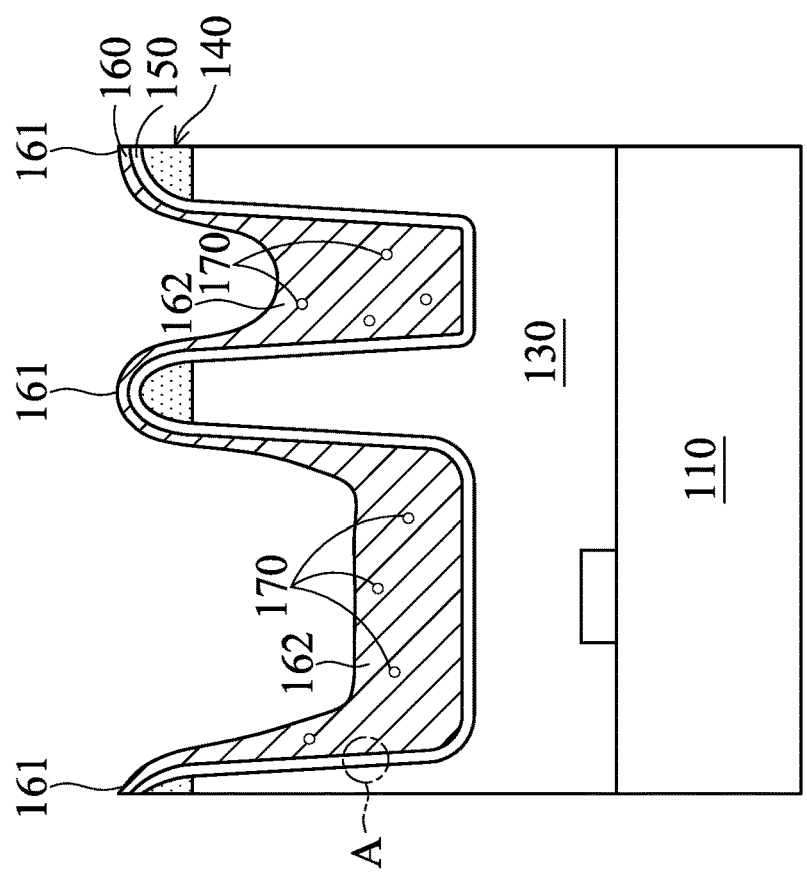
FIG. 1G-1
FIG. 1G

METHOD FOR FORMING A SEMICONDUCTOR STRUCTURE BY DIFFUSING MANGANESE FROM A SEED LAYER TO A BARRIER LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1K are cross-sectional views of various stages of a process for forming a semiconductor device structure, in accordance with some embodiments.

FIG. 1E-1 is an enlarged view of a portion of the semiconductor device structure of FIG. 1E, in accordance with some embodiments.

FIG. 1G-1 is an enlarged view of a portion of the semiconductor device structure of FIG. 1G, in accordance with some embodiments.

FIG. 1I-1 is an enlarged view of a portion of the semiconductor device structure of FIG. 1I, in accordance with some embodiments.

FIG. 1K-1 is an enlarged view of a portion of the semiconductor device structure of FIG. 1K, in accordance with some embodiments.

FIGS. 2A-2J are cross-sectional views of various stages of a process for forming a semiconductor device structure, in accordance with some embodiments.

FIG. 2B-1 is an enlarged view of a portion of the semiconductor device structure of FIG. 2B, in accordance with some embodiments.

FIG. 2D-1 is an enlarged view of a portion of the semiconductor device structure of FIG. 2D, in accordance with some embodiments.

FIG. 2F-1 is an enlarged view of a portion of the semiconductor device structure of FIG. 2F, in accordance with some embodiments.

FIG. 2H-1 is an enlarged view of a portion of the semiconductor device structure of FIG. 2H, in accordance with some embodiments.

FIG. 2J-1 is an enlarged view of a portion of the semiconductor device structure of FIG. 2J, in accordance with some embodiments.

DETAILED DESCRIPTION

Figure 1D:
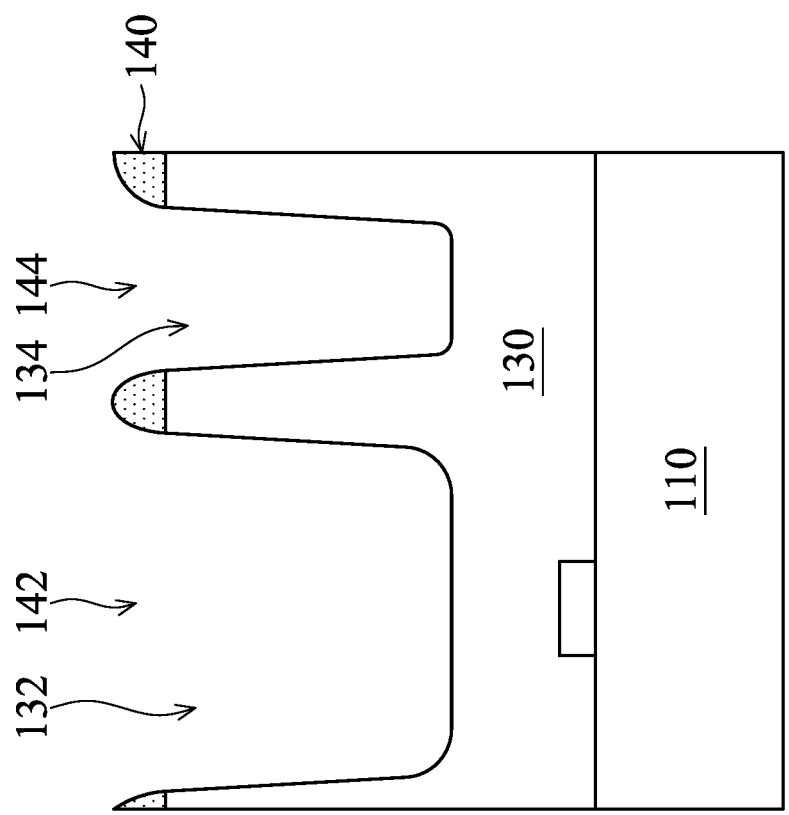

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x #5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1K are cross-sectional views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, various device elements 120 are formed over and/or in the substrate 110, in accordance with some embodiments. For the sake of simplicity and clarity, FIG. 1A only shows one of the device elements 120, in accordance with some embodiments.

Examples of the various device elements 120 include active devices, passive devices, other suitable elements (e.g., conductive lines), or a combination thereof. The active devices may include transistors or diodes formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements 120. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate the device elements 120 formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, a dielectric layer 130 is then deposited over the substrate 110 and the device elements 120, in accordance with some embodiments. The dielectric layer 130 is made of any suitable dielectric material, such as silicon oxide, silicon oxynitride, SiOC, SiOCN, borosilicate glass (BSG), phosphoric silicate glass (PSG), silicon oxycarbide (SiCO:H), a low-k material, a porous dielectric material, or a combination thereof, in accordance with some embodiments.

The dielectric layer 130 is deposited by any suitable process, such as a chemical vapor deposition (CVD) process, a high density plasma chemical vapor deposition (HDPCVD) process, a spin-on process, a sputtering process, or a combination thereof, in accordance with some embodiments. In some embodiments (not shown), an etch stop layer is deposited over the substrate 110 and the device elements 120, and the dielectric layer 130 is deposited over the etch stop layer, in accordance with some embodiments.

As shown in FIG. 1A, a mask layer 140 is formed over the dielectric layer 130, in accordance with some embodiments. The mask layer 140 is made of a material different from the material of the dielectric layer 130, in accordance with some embodiments.

The mask layer 140 is made of nitrides (e.g., silicon nitride), oxynitride (e.g., silicon oxynitride). TEOS (tetraethyl-ortho-silane), tungsten carbide (WC), TiN, or a nitrogen free anti-reflective coating (NFARC) material, in accordance with some embodiments. The mask layer 140 is a combination of 1 to 5 layers or more, in accordance with some embodiments. The mask layer 140 is formed by any suitable process, such as a chemical vapor deposition (CVD) process, a physical vapor deposition (PVD) process, or a combination thereof, in accordance with some embodiments.

As shown in FIG. 1A, a mask layer MI is formed over the mask layer 140, in accordance with some embodiments. The mask layer MI has trenches OP1 and OP2, in accordance with some embodiments. The trenches OP1 and OP2 expose portions of the mask layer 140, in accordance with some embodiments.

The mask layer MI is made of a photoresist material or another suitable material, which is different from the material of the mask layer 140, in accordance with some embodiments. The mask layer MI is a combination of 1 to 5 layers or more, in accordance with some embodiments. The number of the layers depends on the following etching processes. The mask layer MI is formed using a photolithography process, in accordance with some embodiments.

As shown in FIG. 1B, the exposed portions of the mask layer 140 are removed through the trenches OP1 and OP2 of the mask layer MI to form trenches 142 and 144 in the mask layer 140, in accordance with some embodiments. The trenches 142 and 144 expose portions of the dielectric layer 130, in accordance with some embodiments. The removal process includes an etching process, such as a dry etching process (e.g., a plasma etching process), in accordance with some embodiments.

Figure 1C:
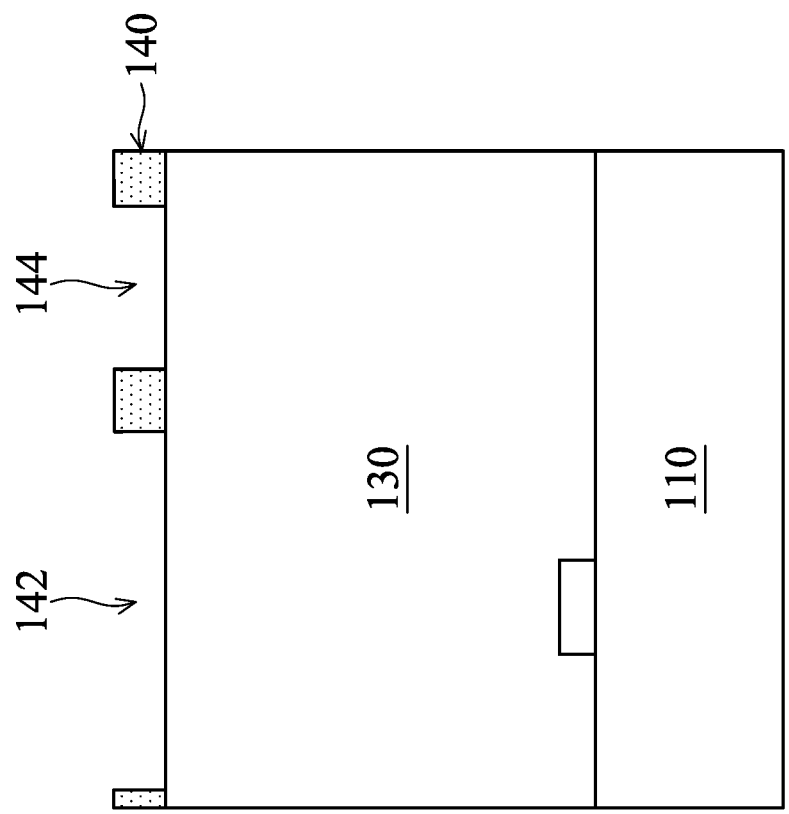

As shown in FIG. 1C, the mask layer MI is removed, in accordance with some embodiments. The removal process includes an etching process, such as a dry etching process (e.g., a plasma etching process) and/or a wet etching process, in accordance with some embodiments.

As shown in FIG. 1D, portions of the dielectric layer 130 are removed through the trenches 142 and 144 of the mask layer 140, in accordance with some embodiments. The removal process forms trenches 132 and 134 in the dielectric layer 130, in accordance with some embodiments.

The removal process also etches the edges of the mask layer 140, and therefore the edges of the mask layer 140 are rounded, in accordance with some embodiments. The removal process includes an etching process, such as a dry etching process (e.g., a plasma etching process), in accordance with some embodiments.

Figures 1, 1E:
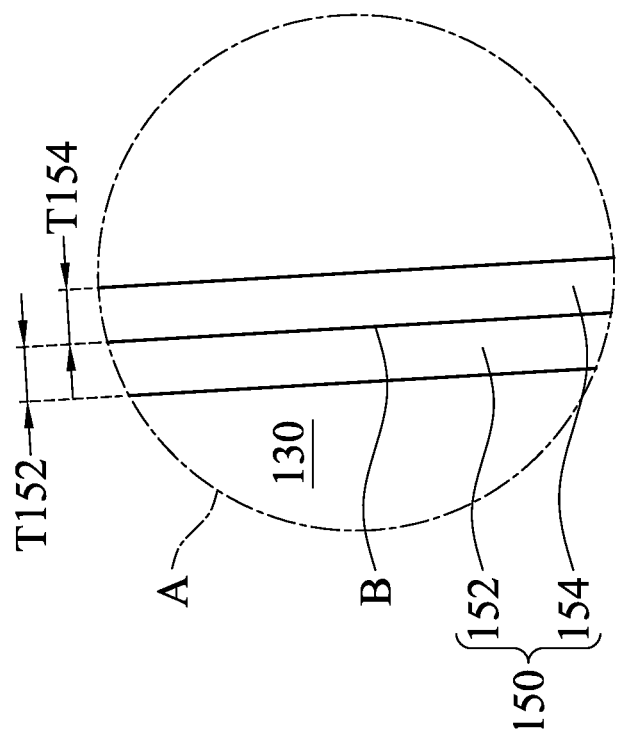
Figure 1E:
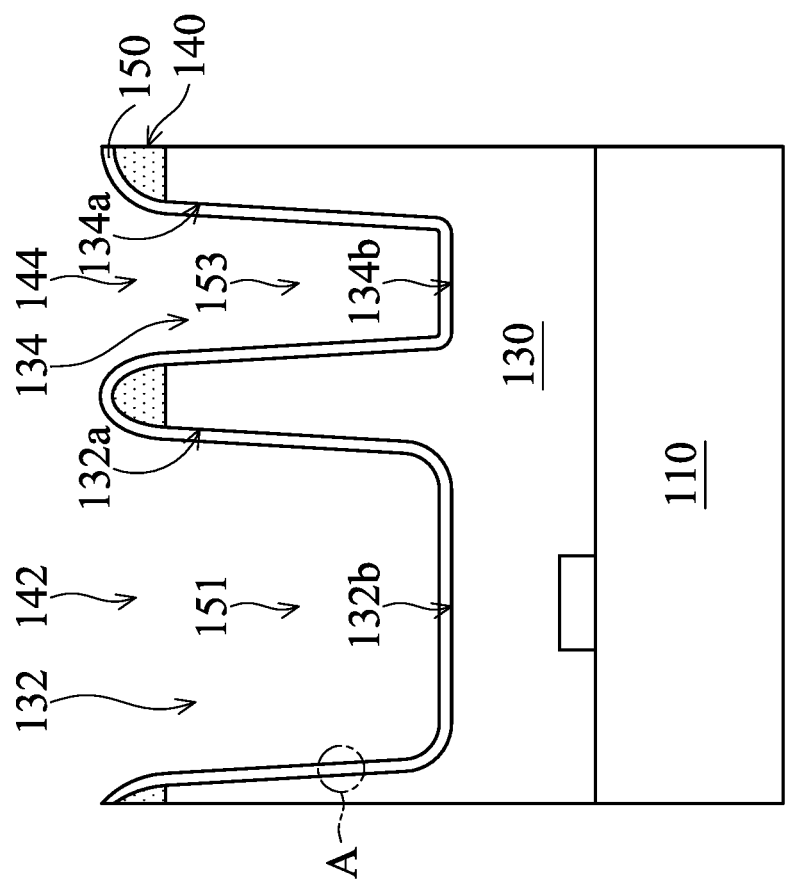

FIG. 1E-1 is an enlarged view of a portion A of the semiconductor device structure of FIG. 1E, in accordance with some embodiments. As shown in FIGS. 1E and 1E-1, a barrier layer 150 is formed in the trenches 132 and 134 of the dielectric layer 130 and the trenches 142 and 144 of the mask layer 140, in accordance with some embodiments.

The barrier layer 150 is conformally formed over the mask layer 140, inner walls 132a and a bottom surface 132b of the trench 132, and inner walls 134a and a bottom surface 134b of the trench 134, in accordance with some embodiments. Therefore, the barrier layer 150 has trenches 151 and 153 respectively in the trenches 132 and 134, in accordance with some embodiments.

The barrier layer 150 is configured to block the diffusion of metal atoms of a conductive layer subsequently formed on the barrier layer 150, in accordance with some embodiments. The barrier layer 150 has layers 152 and 154, in accordance with some embodiments.

The layer 154 is over the layer 152, in accordance with some embodiments. The layer 152 has a thickness T152 ranging from about 5 Å to about 40 Å, in accordance with some embodiments. The layer 154 has a thickness T154 ranging from about 5 Å to about 80 Å, in accordance with some embodiments.

The formation of the barrier layer 150 includes depositing the layer 152 in the trenches 132 and 134; and depositing the layer 154 over the layer 152, in accordance with some embodiments. The layers 152 and 154 are made of different materials, in accordance with some embodiments.

In some embodiments, the barrier layer 150 includes tantalum, tantalum nitrides, cobalt (Co), ruthenium (Ru), titanium, titanium nitrides, or other suitable materials. In some embodiments, the layer 152 is made of tantalum nitrides, and the layer 154 is made of cobalt, ruthenium, tantalum, or titanium.

In some other embodiments (not shown), the barrier layer 150 further includes one or more layers over the layer 154, and the one or more layers are made of cobalt, ruthenium, tantalum, or titanium. The one or more layers and the layer 154 are made of different materials, in accordance with some embodiments. In some embodiments, the barrier layer 150 is formed by a physical vapor deposition (PVD) process, a chemical vapor deposition (CVD) process, an atomic layer deposition (ALD) process, or another suitable process.

Figure 1F:
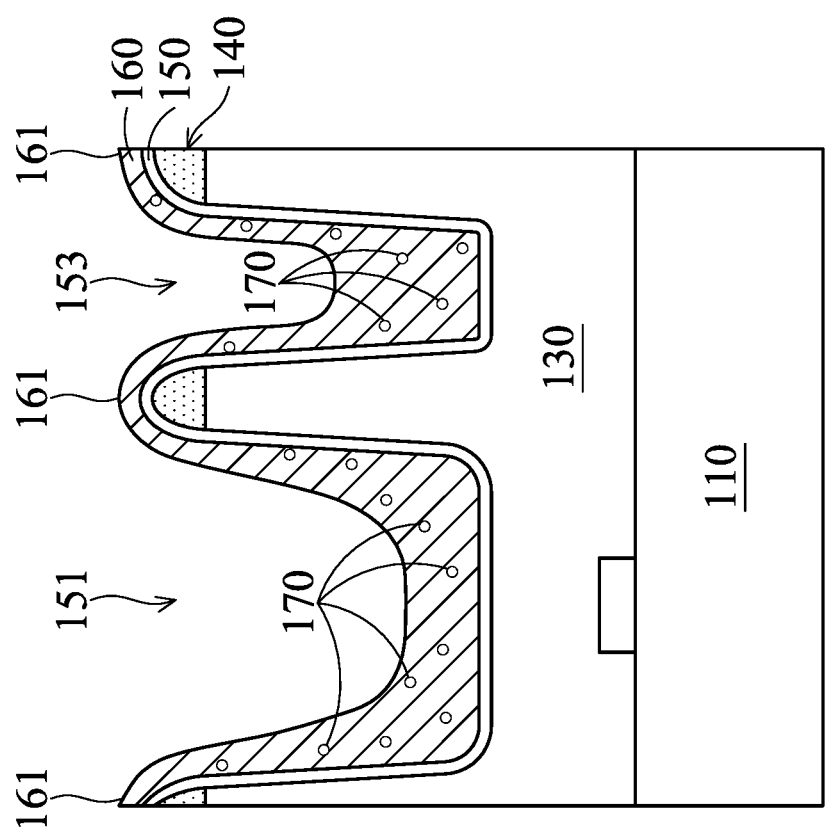

Thereafter, as shown in FIG. 1F, a seed layer 160 is formed over the barrier layer 150 and in the trenches 151 and 153 of the barrier layer 150, in accordance with some embodiments. The seed layer 160 is doped with manganese 170, in accordance with some embodiments.

In some embodiments, an atomic concentration of the manganese 170 in the seed layer 160 ranges from about 0.5% to about 2.5%. The manganese 170 is able to improve the adhesion between the seed layer 160 and the barrier layer 150, in accordance with some embodiments.

The seed layer 160 includes copper, copper alloys, cobalt (Co), ruthenium (Ru) or other suitable conductive materials, in accordance with some embodiments. In some embodiments, the seed layer 160 is formed by a physical vapor deposition (PVD) process, a chemical vapor deposition (CVD) process, an electroless plating process, or another suitable process. The physical vapor deposition process includes a plasma deposition process, in accordance with some embodiments.

FIG. 1G-1 is an enlarged view of a portion A of the semiconductor device structure of FIG. 1G, in accordance with some embodiments. As shown in FIGS. 1G and 1G-1, the seed layer 160 is annealed in a process gas, in accordance with some embodiments.

The process gas includes a hydrogen gas, in accordance with some embodiments. The process gas has a high hydrogen volume concentration, in accordance with some embodiments. In some embodiments, the process gas further includes nitrogen or an inert gas.

The manganese 170 diffuses from the seed layer 160 to the barrier layer 150 during the annealing of the seed layer 160 in the process gas, in accordance with some embodiments. In the process gas with the high hydrogen volume concentration, the manganese 170 tends to move to the barrier layer 150, in accordance with some embodiments.

The manganese 170 in the barrier layer 150 improves electromigration resistance of the barrier layer 150, in accordance with some embodiments. After the seed layer 160 is annealed, an atomic concentration of the manganese 170 in the barrier layer 150 is greater than an atomic concentration of the manganese 170 in the seed layer 160, in accordance with some embodiments.

As shown in FIGS. 1F and 1G, the seed layer 160 is reflowed and therefore upper portions 161 of the seed layer 160 partially flow downwardly during the annealing of the seed layer 160 in the process gas, in accordance with some embodiments. Therefore, the upper portions 161 become thinner and the lower portions 162 of the seed layer 160 become thicker, in accordance with some embodiments.

The hydrogen tends to react with the residue in or on the seed layer 160 to form volatile species that can be removed from the chamber, which may form voids in the seed layer 160, in accordance with some embodiments. The reflowed seed layer 160 fills the voids during the annealing process, in accordance with some embodiments.

In some embodiments, a volume ratio of the hydrogen gas to the process gas ranges from about 50% to about 100%. The volume ratio of the hydrogen gas to the process gas ranges from about 60% to about 100%, in accordance with some embodiments. If the volume ratio of the hydrogen gas to the process gas is less than about 50%, the manganese 170 diffusing from the seed layer 160 to the barrier layer 150 is not enough to improve electromigration resistance of the barrier layer 150, in accordance with some embodiments.

The partial pressure of hydrogen in the process gas ranges from about 400 torr to about 760 torr, in accordance with some embodiments. The process temperature of the annealing process ranges from about 200° C. to about 400° C., in accordance with some embodiments. The process time of the annealing process ranges from about 1 minute to about 10 minutes, in accordance with some embodiments.

As shown in FIG. 1G-1, the barrier layer 150 has a hole 156, in accordance with some embodiments. In some embodiments, the hole 156 is formed during the formation of the seed layer 160. The process for forming the seed layer 160 may damage the barrier layer 150. In some other embodiments (not shown), the hole 156 is formed during the formation of the barrier layer 150.

The manganese 170 diffuses from the seed layer 160 into the hole 156 to react with the oxygen atoms in the dielectric layer 130 after the seed layer 160 is annealed, in accordance with some embodiments. In some embodiments, an atomic concentration of the manganese 170 in the hole 156 is greater than the atomic concentration of the manganese 170 in the barrier layer 150 after the seed layer 160 is annealed.

Since the manganese 170 fills the hole 156, the manganese 170 repairs the barrier layer 150, which improves electromigration resistance (or barrier ability) of the barrier layer 150, in accordance with some embodiments. Therefore, the yield and the reliability of conductive lines subsequently formed on the barrier layer 150 are improved, which reduces the resistance of the conductive lines, in accordance with some embodiments.

Figure 1H:
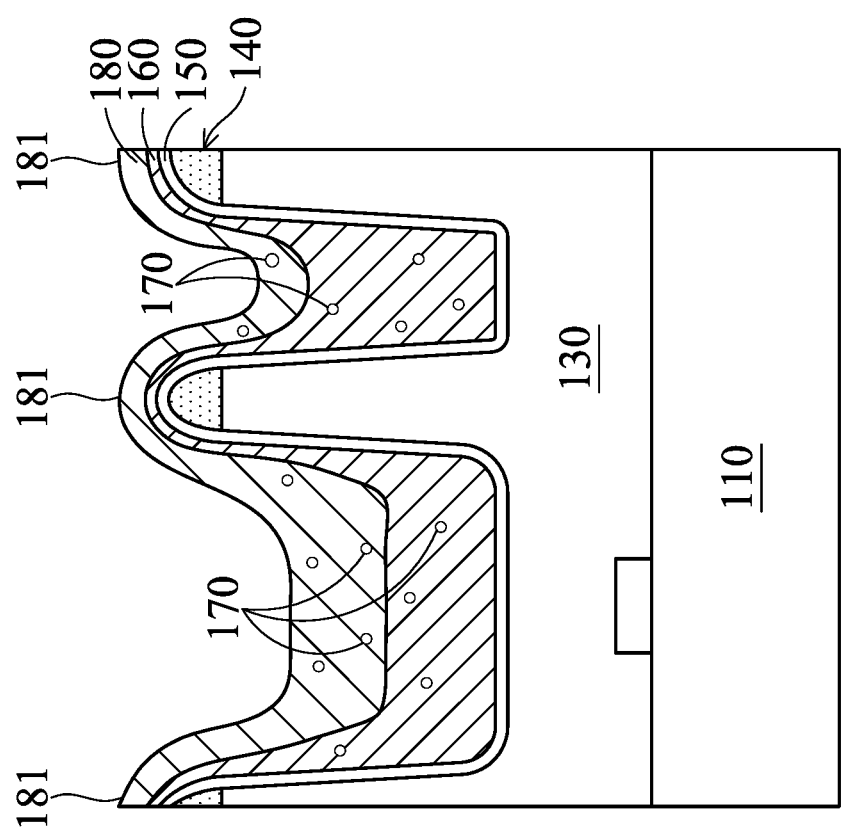

Afterwards, as shown in FIG. 1H, a conductive layer 180 is formed over the seed layer 160, in accordance with some embodiments. The conductive layer 180 is doped with manganese 170, in accordance with some embodiments. In some embodiments, an atomic concentration of the manganese 170 in the conductive layer 180 ranges from about 0.5% to about 2.5%.

The conductive layer 180 includes copper, copper alloys, cobalt (Co), ruthenium (Ru) or other suitable conductive materials, in accordance with some embodiments. In some embodiments, the conductive layer 180 is formed by a physical vapor deposition (PVD) process, a chemical vapor deposition (CVD) process, an electroless plating process, or another suitable process. The physical vapor deposition process includes a plasma deposition process, in accordance with some embodiments.

Figures 1, 1I:
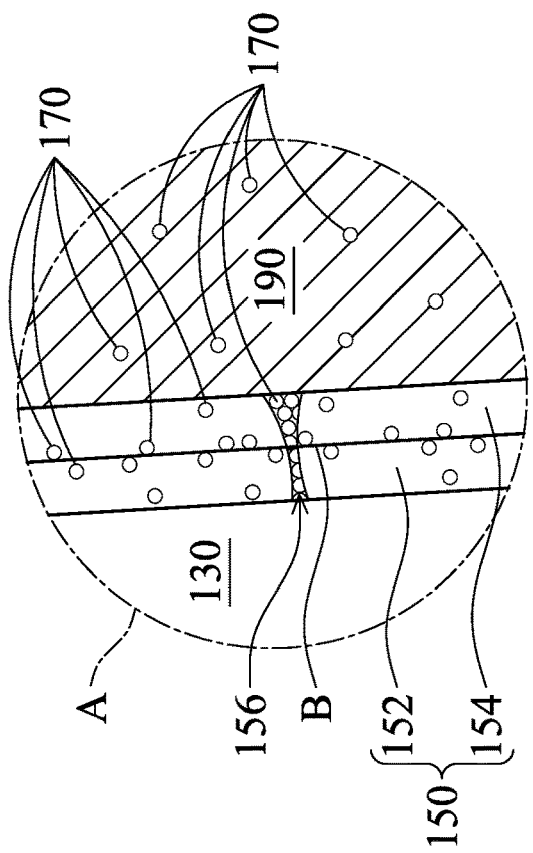
Figure 1I:
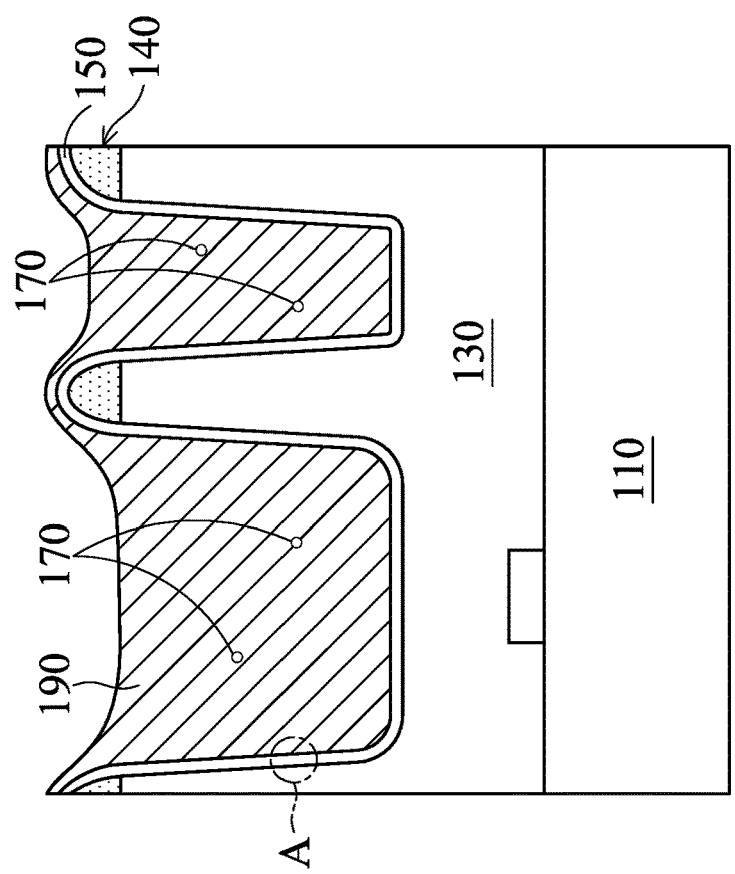

FIG. 1I-1 is an enlarged view of a portion A of the semiconductor device structure of FIG. 1I, in accordance with some embodiments. As shown in FIGS. 1H, 1I, and 1I-1, the conductive layer 180 is annealed in a process gas to fuse the conductive layer 180 with the seed layer 160 so as to form a thick conductive layer 190, in accordance with some embodiments.

The process gas includes a hydrogen gas, in accordance with some embodiments. In some embodiments, the process gas further includes nitrogen or an inert gas. As shown in FIGS. 1H, 1I, and 1I-1, upper portions 181 of the conductive layer 180 flow downwardly during the annealing of the conductive layer 180, in accordance with some embodiments.

In some embodiments, a volume ratio of the hydrogen gas to the process gas ranges from about 50% to about 100%. The volume ratio of the hydrogen gas to the process gas ranges from about 60% to about 100%, in accordance with some embodiments.

The partial pressure of hydrogen in the process gas ranges from about 400 torr to about 760 torr, in accordance with some embodiments. The process temperature of the annealing process ranges from about 200° C. to about 400° C., in accordance with some embodiments.

The manganese 170 diffuses from the conductive layer 180 to the barrier layer 150 during the annealing of the conductive layer 180 in the process gas, in accordance with some embodiments. After the conductive layer 180 is annealed, an atomic concentration of the manganese 170 in the barrier layer 150 is greater than an atomic concentration of the manganese 170 in the thick conductive layer 190, in accordance with some embodiments. The thick conductive layer 190 is embedded in the barrier layer 150, in accordance with some embodiments. The barrier layer 150 is embedded in the dielectric layer 130, in accordance with some embodiments.

Figure 1J:
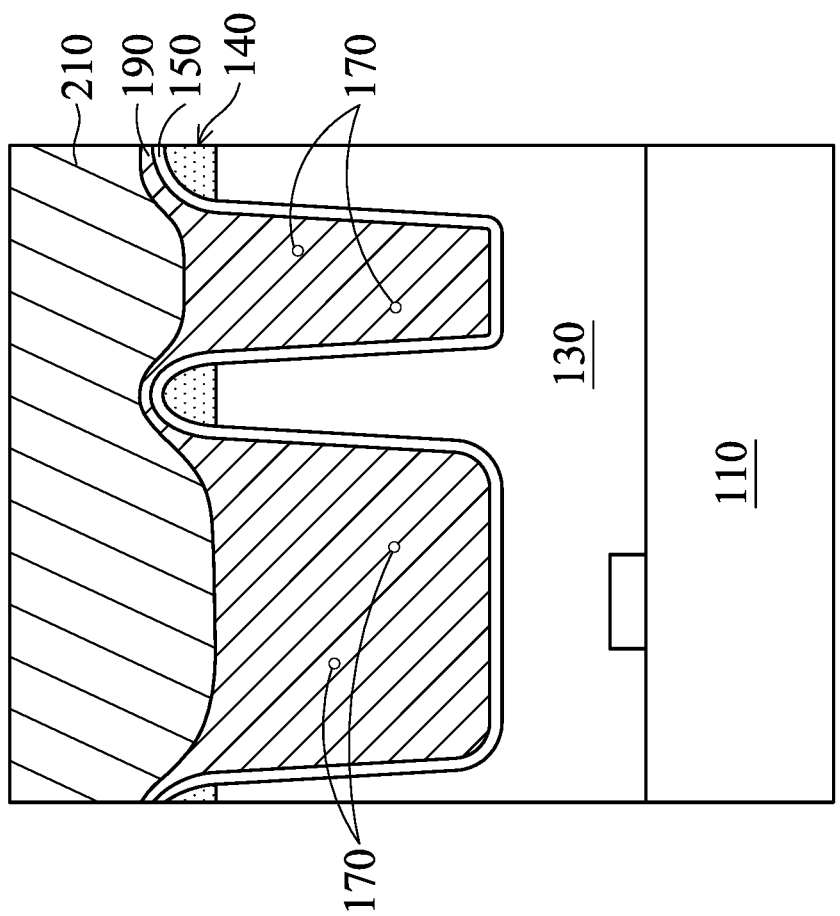

As shown in FIG. 1J, a conductive layer 210 is formed over the thick conductive layer 190, in accordance with some embodiments. The conductive layer 210 includes copper, copper alloys, cobalt (Co), ruthenium (Ru) or other suitable conductive materials, in accordance with some embodiments. In some embodiments, the conductive layer 210 is formed by an electroplating process.

Figures 1, 1K:
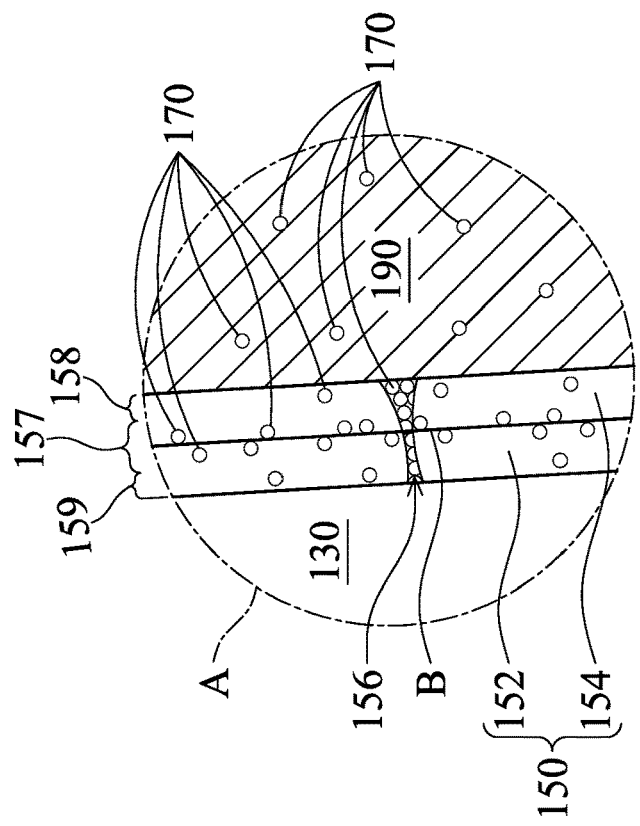
Figure 1K:
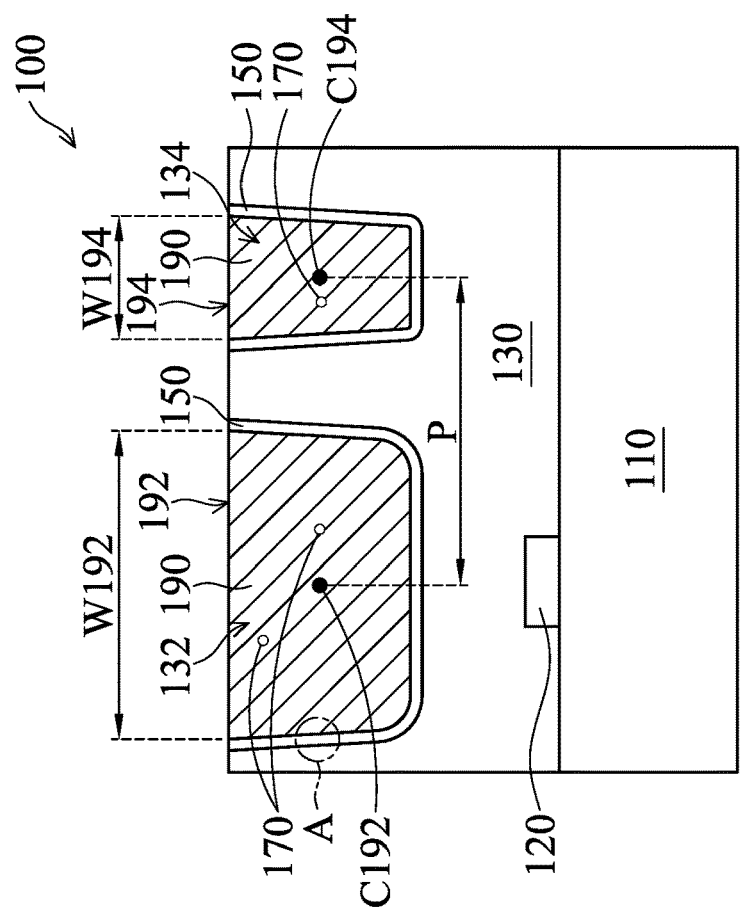

FIG. 1K-I is an enlarged view of a portion A of the semiconductor device structure of FIG. 1K, in accordance with some embodiments. As shown in FIGS. 1K and 1K-1, the conductive layer 210, the mask layer 140, and upper portions of the thick conductive layer 190, the dielectric layer 130, and the barrier layer 150 are removed, in accordance with some embodiments. The removal process includes a planarization process, such as a chemical mechanical polishing process, in accordance with some embodiments.

After the removal process, the conductive layer 190 remaining in the trench 132 forms a conductive line 192, and the conductive layer 190 remaining in the trench 134 forms a conductive line 194, in accordance with some embodiments. The width W192 of the conductive line 192 is less than or equal to about 2000 nm, in accordance with some embodiments. The width W192 ranges from about 1 nm to about 2000 nm, in accordance with some embodiments. In some embodiments, the width W192 is greater than about 2000 nm, in accordance with some embodiments.

In some embodiments, a pitch P (or a distance) between the center C192 of the conductive line 192 and the center C194 of the conductive line 194 ranges from about 1 nm to about 150 nm, in accordance with some embodiments. The pitch P ranges from about 1 nm to about 40 nm, in accordance with some embodiments. In some embodiments, the pitch P is greater than about 150 nm, in accordance with some embodiments.

The barrier layer 150 has a central portion 157 and peripheral portions 158 and 159, in accordance with some embodiments. The peripheral portion 158 is adjacent to the thick conductive layer 190, in accordance with some embodiments. The peripheral portion 159 is adjacent to the dielectric layer 130, in accordance with some embodiments.

The concentration of the manganese 170 in the central portion 157 is greater than the atomic concentration of the manganese 170 in the peripheral portion 158, in accordance with some embodiments. The concentration of the manganese 170 in the central portion 157 is greater than the atomic concentration of the manganese 170 in the peripheral portion 159, in accordance with some embodiments.

The boundary B between the layers 152 and 154 is in the central portion 157, in accordance with some embodiments. In this step, a semiconductor device structure 100 is substantially formed, in accordance with some embodiments. The manganese 170 reduces the resistance of the conductive lines 192 and 194, in accordance with some embodiments.

Figure 2A:
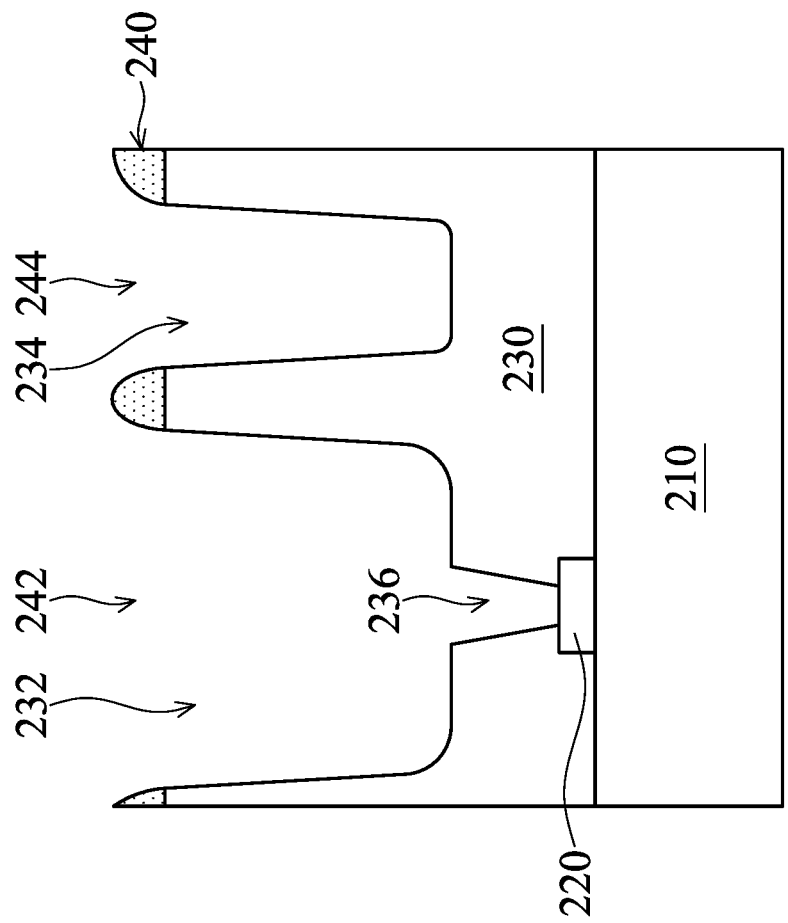

FIGS. 2A-2J are cross-sectional views of various stages of a process for forming a semiconductor device structure, in accordance with some embodiments. As shown in FIG. 2A, a substrate 210 is provided, in accordance with some embodiments. The substrate 210 includes, for example, a semiconductor substrate. The substrate 210 includes, for example, a semiconductor wafer (such as a silicon wafer) or a portion of a semiconductor wafer.

In some embodiments, the substrate 210 is made of an elementary semiconductor material including silicon or germanium in a single crystal structure, a polycrystal structure, or an amorphous structure. In some other embodiments, the substrate 210 is made of a compound semiconductor, such as silicon carbide, gallium arsenide, gallium phosphide, indium phosphide, indium arsenide, an alloy semiconductor, such as SiGe or GaAsP, or a combination thereof. The substrate 210 may also include multi-layer semiconductors, semiconductor on insulator (SOI) (such as silicon on insulator or germanium on insulator), or a combination thereof.

As shown in FIG. 2A, various device elements 220 are formed over and/or in the substrate 210, in accordance with some embodiments. For the sake of simplicity and clarity, FIG. 2A only shows one of the device elements 220, in accordance with some embodiments.

Examples of the various device elements 220 include active devices, passive devices, other suitable elements (e.g., conductive lines), or a combination thereof. The active devices may include transistors or diodes formed at a surface of the substrate 210. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements 220. The FEOL semiconductor fabrication processes may include deposition, etching, implantation, photolithography, annealing, planarization, one or more other applicable processes, or a combination thereof.

In some embodiments, isolation features (not shown) are formed in the substrate 210. The isolation features are used to surround active regions and electrically isolate the various device elements 220 formed in and/or over the substrate 210 in the active regions. In some embodiments, the isolation features include shallow trench isolation (STI) features, local oxidation of silicon (LOCOS) features, other suitable isolation features, or a combination thereof.

As shown in FIG. 2A, a dielectric layer 230 is then deposited over the substrate 210 and the device elements 220, in accordance with some embodiments. The dielectric layer 230 is made of any suitable dielectric material, such as silicon oxide, silicon oxynitride, SiOC, SiOCN, borosilicate glass (BSG), phosphoric silicate glass (PSG), silicon oxycarbide (SiCO:H), a low-k material, a porous dielectric material, or a combination thereof, in accordance with some embodiments.

The dielectric layer 230 is deposited by any suitable process, such as a chemical vapor deposition (CVD) process, a high density plasma chemical vapor deposition (HDPCVD) process, a spin-on process, a sputtering process, or a combination thereof, in accordance with some embodiments.

As shown in FIG. 2A, a mask layer 240 is formed over the dielectric layer 230, in accordance with some embodiments. The mask layer 240 has trenches 242 and 244, in accordance with some embodiments. The mask layer 240 is made of a material different from the materials of the dielectric layer 230, in accordance with some embodiments.

The mask layer 240 is made of nitrides (e.g., silicon nitride) or oxynitride (e.g., silicon oxynitride), TEOS (tetra-ethyl-ortho-silane), tungsten carbide (WC), TiN, or a nitrogen free anti-reflective coating (NFARC) material, in accordance with some embodiments. The mask layer 240 is a combination of 1 to 5 layers or more, in accordance with some embodiments. The mask layer 240 is formed by any suitable process, such as a chemical vapor deposition (CVD) process, a physical vapor deposition (PVD) process, or a combination thereof, in accordance with some embodiments.

As shown in FIG. 2A, portions of the dielectric layer 230 are removed through the trenches 242 and 244 of the mask layer 240, in accordance with some embodiments. The removal process forms trenches 232 and 234 in the dielectric layer 230, in accordance with some embodiments.

The removal process also etches the edges of the mask layer 240, and therefore the edges of the mask layer 240 are rounded, in accordance with some embodiments. The removal process includes an etching process, such as a dry etching process (e.g., a plasma etching process), in accordance with some embodiments.

Thereafter, as shown in FIG. 2A, a portion of the dielectric layer 230 is removed to form a via 236 in the dielectric layer 230, in accordance with some embodiments. The via 236 exposes a portion of the device element 220, in accordance with some embodiments.

Figures 1, 2B:
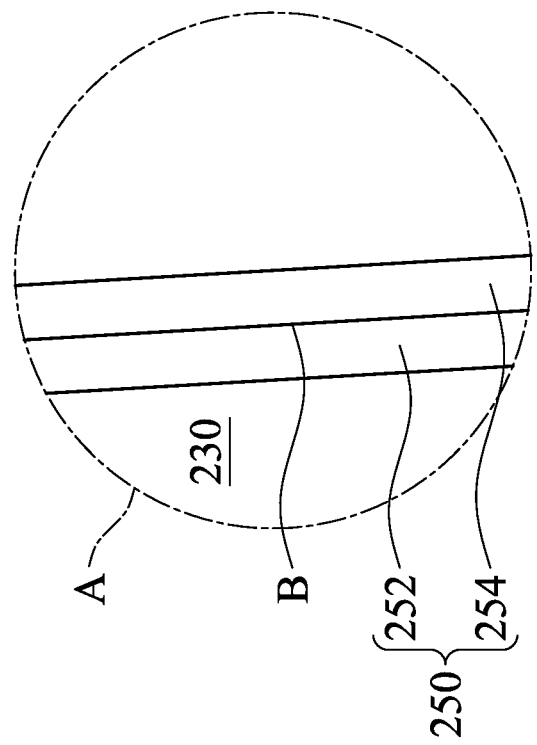
Figure 2B:
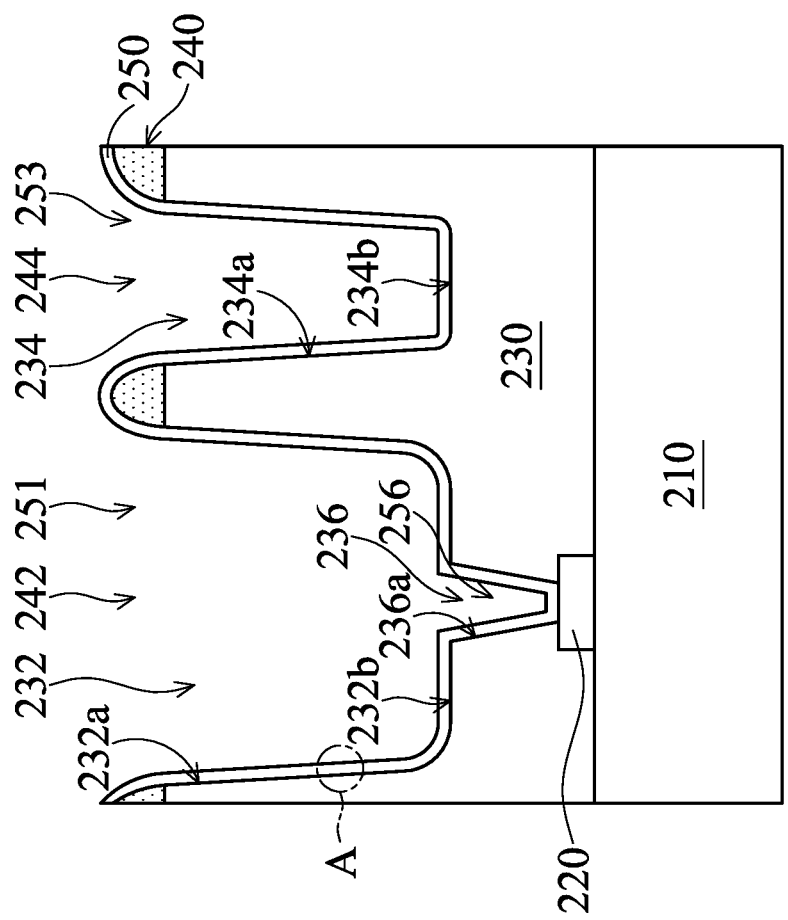

FIG. 2B-1 is an enlarged view of a portion A of the semiconductor device structure of FIG. 2B, in accordance with some embodiments. As shown in FIGS. 2B and 2B-1, a barrier layer 250 is formed in the trenches 232 and 234 and the via 236 of the dielectric layer 230 and the trenches 242 and 244 of the mask layer 240, in accordance with some embodiments.

The barrier layer 250 is conformally formed over the mask layer 240, inner walls 232a and a bottom surface 232b of the trench 232, inner walls 234a and a bottom surface 234b of the trench 234, inner walls 236a of the via 236, and the device element 220, in accordance with some embodiments. Therefore, the barrier layer 250 has trenches 251 and 253 and a via 256 respectively in the trenches 232 and 234 and the via 236, in accordance with some embodiments.

The barrier layer 250 is configured to block the diffusion of metal atoms of a conductive layer subsequently formed on the barrier layer 250, in accordance with some embodiments. The barrier layer 250 has a layer 252 and a layer 254, in accordance with some embodiments.

The layer 254 is over the layer 252, in accordance with some embodiments. The formation of the barrier layer 250 includes depositing the layer 252 in the trenches 232 and 234; and depositing the layer 254 over the layer 252, in accordance with some embodiments. The layers 252 and 254 are made of different materials, in accordance with some embodiments.

In some embodiments, the barrier layer 250 includes tantalum, tantalum nitrides, cobalt (Co), ruthenium (Ru), titanium, titanium nitrides, or other suitable materials. In some embodiments, the layer 252 is made of tantalum nitrides, and the layer 254 is made of cobalt, ruthenium, tantalum, or titanium.

In some other embodiments (not shown), the barrier layer 250 further includes one or more layers over the layer 254, and the one or more layers are made of cobalt, ruthenium, tantalum, or titanium. The one or more layers and the layer 254 are made of different materials, in accordance with some embodiments.

In some embodiments, the barrier layer 250 is formed by a physical vapor deposition (PVD) process, a chemical vapor deposition (CVD) process, an atomic layer deposition (ALD) process, or another suitable process.

Figure 2C:
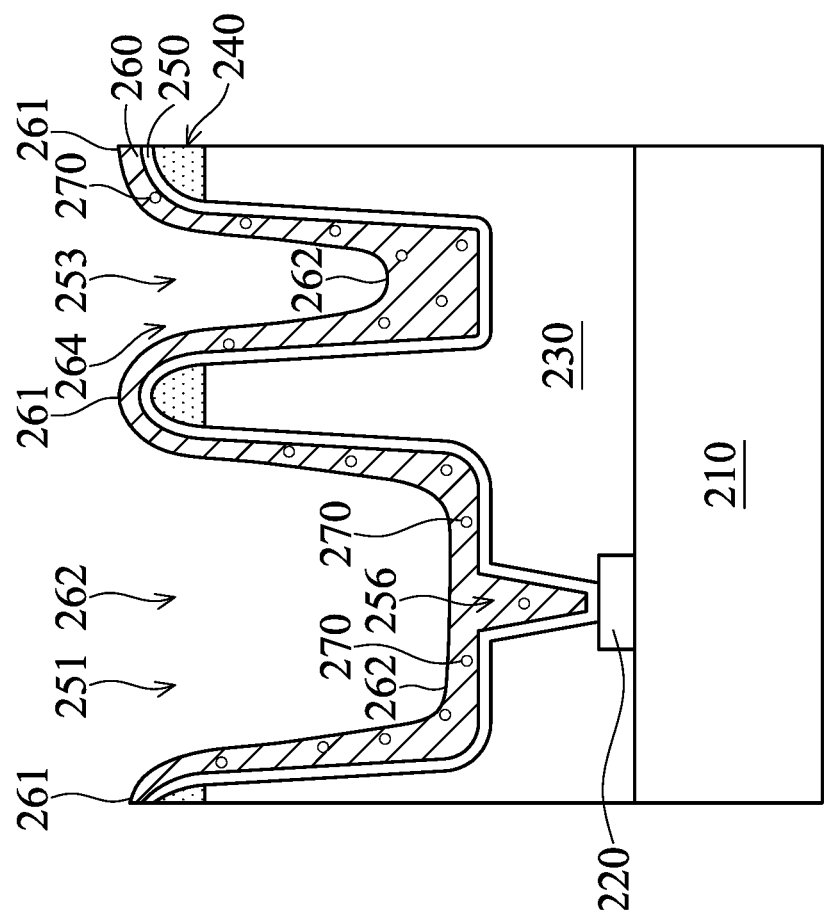

Thereafter, as shown in FIG. 2C, a seed layer 260 is formed over the barrier layer 250 and in the trenches 251 and 253 of the barrier layer 250, in accordance with some embodiments. The seed layer 260 is doped with manganese 270, in accordance with some embodiments. In some embodiments, an atomic concentration of the manganese 270 in the seed layer 260 ranges from about 0.5% to about 2.5%.

The seed layer 260 includes copper, copper alloys, cobalt (Co), ruthenium (Ru) or other suitable conductive materials, in accordance with some embodiments. In some embodiments, the seed layer 260 is formed by a physical vapor deposition (PVD) process, a chemical vapor deposition (CVD) process, an electroless plating process, or another suitable process. The physical vapor deposition process includes a plasma deposition process, in accordance with some embodiments.

Figures 1, 2D:
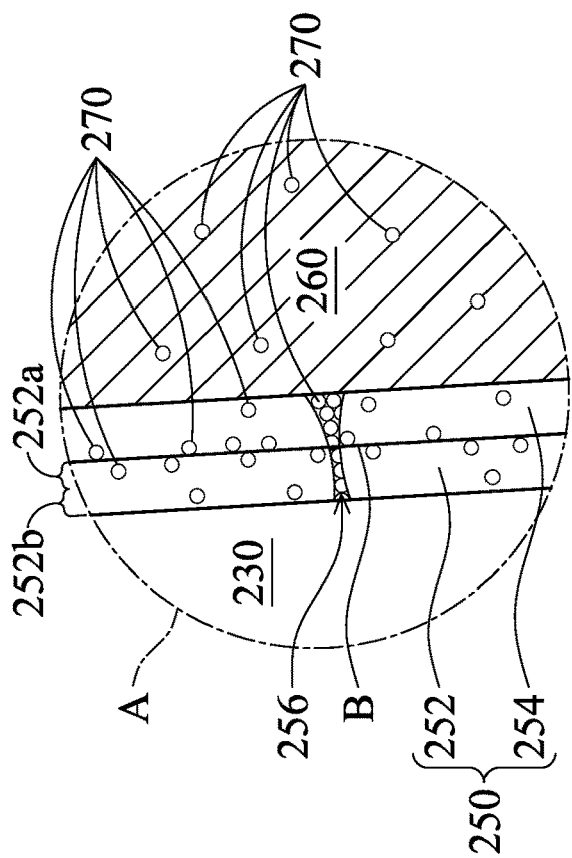
Figure 2D:
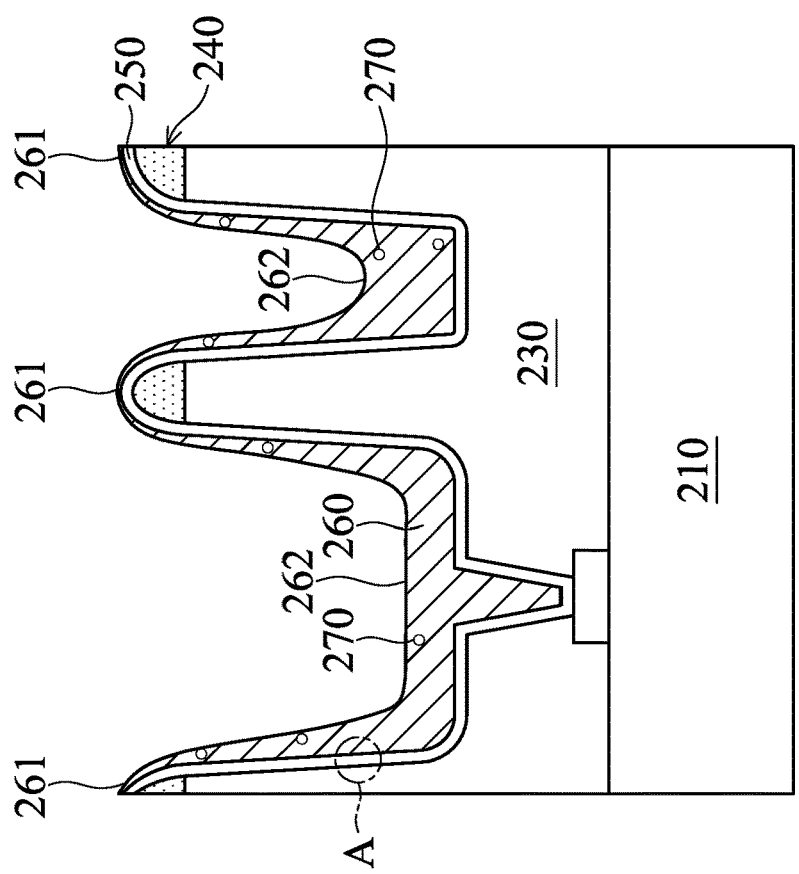

FIG. 2D-1 is an enlarged view of a portion A of the semiconductor device structure of FIG. 2D, in accordance with some embodiments. As shown in FIGS. 2D and 2D-1, the seed layer 260 is annealed in a process gas including a hydrogen gas, in accordance with some embodiments.

In some embodiments, a volume ratio of the hydrogen gas to the process gas ranges from about 50% to about 100%. The volume ratio of the hydrogen gas to the process gas ranges from about 60% to about 100%, in accordance with some embodiments.

The partial pressure of hydrogen in the process gas ranges from about 400 torr to about 760 torr, in accordance with some embodiments. The process temperature of the annealing process ranges from about 200° C. to about 400° C., in accordance with some embodiments.

The manganese 270 diffuses from the seed layer 260 to the barrier layer 250 during the annealing of the seed layer 260 in the process gas, in accordance with some embodiments. After the seed layer 260 is annealed, an atomic concentration of the manganese 270 in the barrier layer 250 is greater than an atomic concentration of the manganese 270 in the seed layer 260, in accordance with some embodiments.

The layer 252 has portions 252a and 252b, in accordance with some embodiments. The portion 252a is adjacent to the layer 254, in accordance with some embodiments. The portion 252b is adjacent to the dielectric layer 230, in accordance with some embodiments. In some embodiments, the atomic concentration of the manganese 270 in the portion 252a is greater than the atomic concentration of the manganese 270 in the portion 252b after the seed layer 260 is annealed, in accordance with some embodiments.

The layer 254 has portion 254a and 254b, in accordance with some embodiments. The portion 254a is adjacent to the layer 252, in accordance with some embodiments. The portion 254b is adjacent to the seed layer 260, in accordance with some embodiments. The concentration of the manganese 270 in the portion 254a is greater than the atomic concentration of the manganese 270 in the portion 254b after the seed layer 260 is annealed, in accordance with some embodiments.

The process gas includes a hydrogen gas, in accordance with some embodiments. In some embodiments, the process gas further includes nitrogen or an inert gas. As shown in FIGS. 2C and 2D, the seed layer 260 is reflowed and therefore upper portions 261 of the seed layer 260 partially flow downwardly during the annealing of the seed layer 260 in the process gas, in accordance with some embodiments. Therefore, the upper portions 261 become thinner and the lower portions 262 of the seed layer 260 become thicker, in accordance with some embodiments.

As shown in FIG. 2D-1, the barrier layer 250 has a hole 256, in accordance with some embodiments. In some embodiments, the hole 256 is formed during the formation of the seed layer 260. The process for forming the seed layer 260 may damage the barrier layer 250. In some other embodiments (not shown), the hole 256 is formed during the formation of the barrier layer 250.

The manganese 270 diffuses from the seed layer 260 into the hole 256 after the seed layer 260 is annealed, in accordance with some embodiments. In some embodiments, an atomic concentration of the manganese 270 in the hole 256 is greater than the atomic concentration of the manganese 270 in the barrier layer 250 after the seed layer 260 is annealed.

Figure 2E:
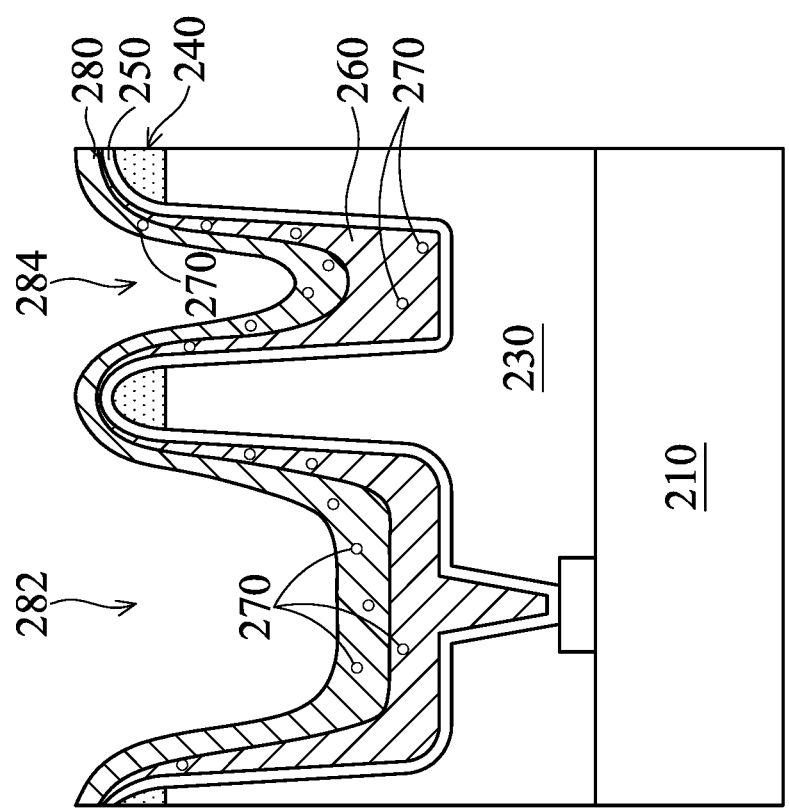

As shown in FIG. 2E, a seed layer 280 is formed over the seed layer 260, in accordance with some embodiments. The seed layer 280 is doped with manganese 270, in accordance with some embodiments. In some embodiments, an atomic concentration of the manganese 270 in the seed layer 280 ranges from about 0.5% to about 2.5%.

The seed layer 280 includes copper, copper alloys, cobalt (Co), ruthenium (Ru) or other suitable conductive materials, in accordance with some embodiments. In some embodiments, the seed layer 280 is formed by a physical vapor deposition (PVD) process, a chemical vapor deposition (CVD) process, an electroless plating process, or another suitable process. The physical vapor deposition process includes a plasma deposition process, in accordance with some embodiments.

Figures 1, 2F:
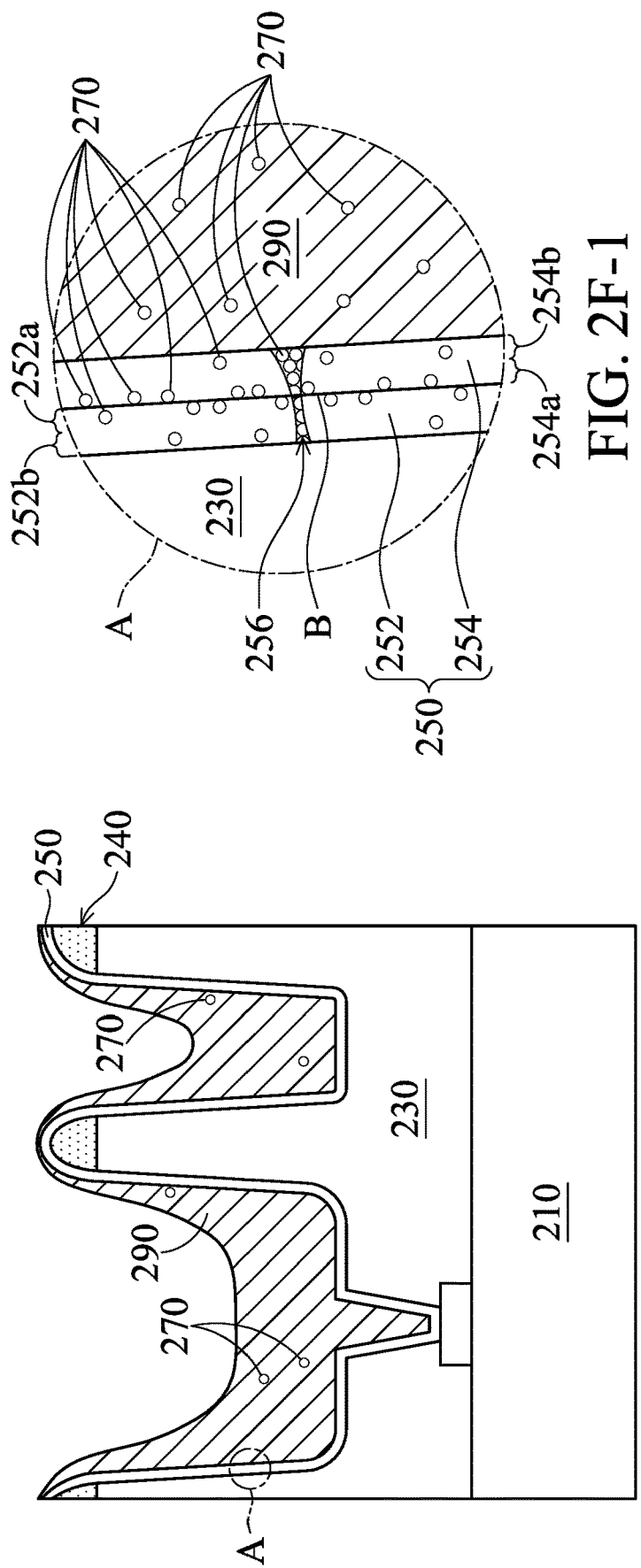

FIG. 2F-1 is an enlarged view of a portion A of the semiconductor device structure of FIG. 2F, in accordance with some embodiments. As shown in FIGS. 2F and 2F-1, the seed layers 260 and 280 are annealed in a process gas to fuse the seed layer 260 with the seed layer 280 so as to form a thick seed layer 290, in accordance with some embodiments.

The process gas includes a hydrogen gas, in accordance with some embodiments. In some embodiments, a volume ratio of the hydrogen gas to the process gas ranges from about 50% to about 100%. The volume ratio of the hydrogen gas to the process gas ranges from about 60% to about 100%, in accordance with some embodiments.

The partial pressure of hydrogen in the process gas ranges from about 400 torr to about 760 torr, in accordance with some embodiments. The process temperature of the annealing process ranges from about 200° C. to about 400° C., in accordance with some embodiments.

The manganese 270 diffuses from the seed layers 260 and 280 to the barrier layer 250 during the annealing of the seed layers 260 and 280 in the process gas, in accordance with some embodiments. After the seed layers 260 and 280 are annealed, an atomic concentration of the manganese 270 in the barrier layer 250 is greater than an atomic concentration of the manganese 270 in the thick seed layer 290, in accordance with some embodiments.

In some embodiments, the atomic concentration of the manganese 270 in the portion 252a is greater than the atomic concentration of the manganese 270 in the portion 252b after the seed layers 260 and 280 are annealed. The concentration of the manganese 270 in the portion 254a is greater than the atomic concentration of the manganese 270 in the portion 254b after the seed layers 260 and 280 are annealed, in accordance with some embodiments.

Figure 2G:
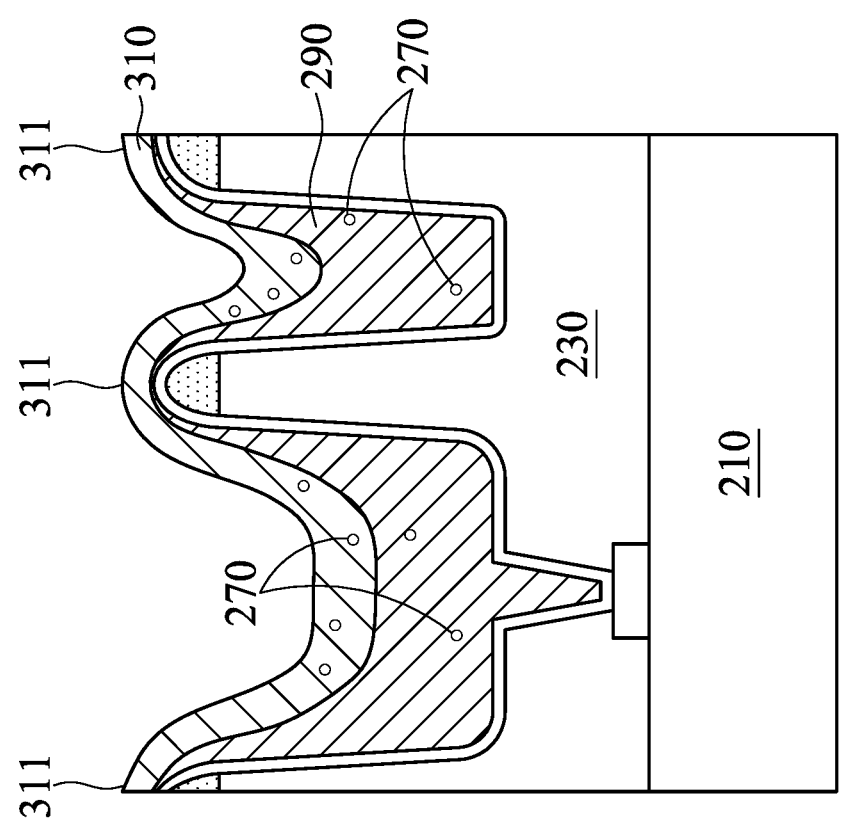

Afterwards, as shown in FIG. 2G, a conductive layer 310 is formed over the thick seed layer 290, in accordance with some embodiments. The conductive layer 310 is doped with manganese 270, in accordance with some embodiments. In some embodiments, an atomic concentration of the manganese 270 in the conductive layer 310 ranges from about 0.5% to about 2.5%.

The conductive layer 310 includes copper, copper alloys, cobalt (Co), ruthenium (Ru) or other suitable conductive materials, in accordance with some embodiments. In some embodiments, the conductive layer 310 is formed by a physical vapor deposition (PVD) process, a chemical vapor deposition (CVD) process, an electroless plating process, or another suitable process. The physical vapor deposition process includes a plasma deposition process, in accordance with some embodiments.

Figures 1, 2H:
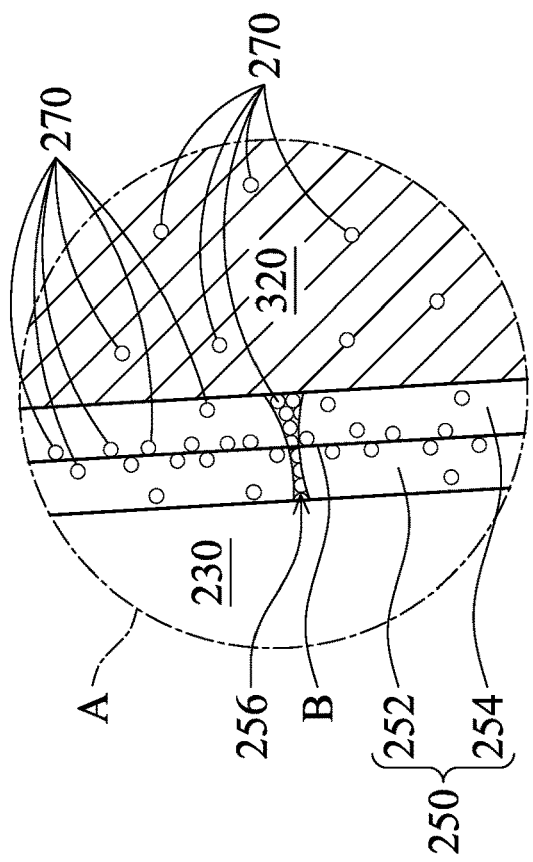
Figure 2H:
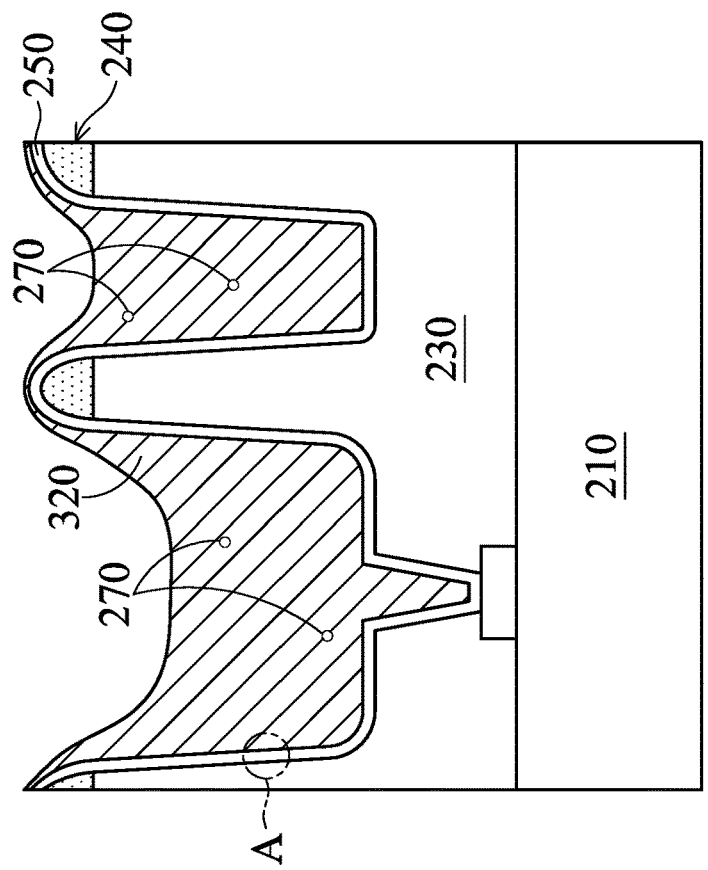

FIG. 2H-1 is an enlarged view of a portion A of the semiconductor device structure of FIG. 2H, in accordance with some embodiments. As shown in FIGS. 2G, 2H, and 2H-1, the conductive layer 310 is annealed in a process gas to fuse the conductive layer 310 with the thick seed layer 290 so as to form a thick conductive layer 320, in accordance with some embodiments. As shown in FIGS. 2G, 2H, and 2H-1, upper portions 311 of the conductive layer 310 flow downwardly during the annealing of the conductive layer 310, in accordance with some embodiments.

The process gas includes a hydrogen gas, in accordance with some embodiments. In some embodiments, the process gas further includes nitrogen or an inert gas. In some embodiments, a volume ratio of the hydrogen gas to the process gas ranges from about 50% to about 100%. The volume ratio of the hydrogen gas to the process gas ranges from about 60% to about 100%, in accordance with some embodiments.

The partial pressure of hydrogen in the process gas ranges from about 400 torr to about 760 torr, in accordance with some embodiments. The process temperature of the annealing process ranges from about 200° C. to about 400° C. in accordance with some embodiments.

The manganese 270 diffuses from the conductive layer 310 to the barrier layer 250 during the annealing of the conductive layer 310 in the process gas, in accordance with some embodiments. After the conductive layer 310 is annealed, an atomic concentration of the manganese 270 in the barrier layer 250 is greater than an atomic concentration of the manganese 270 in the thick conductive layer 320, in accordance with some embodiments.

The thick conductive layer 320 is embedded in the barrier layer 250, in accordance with some embodiments. The barrier layer 250 is embedded in the dielectric layer 230, in accordance with some embodiments.

Figure 2I:
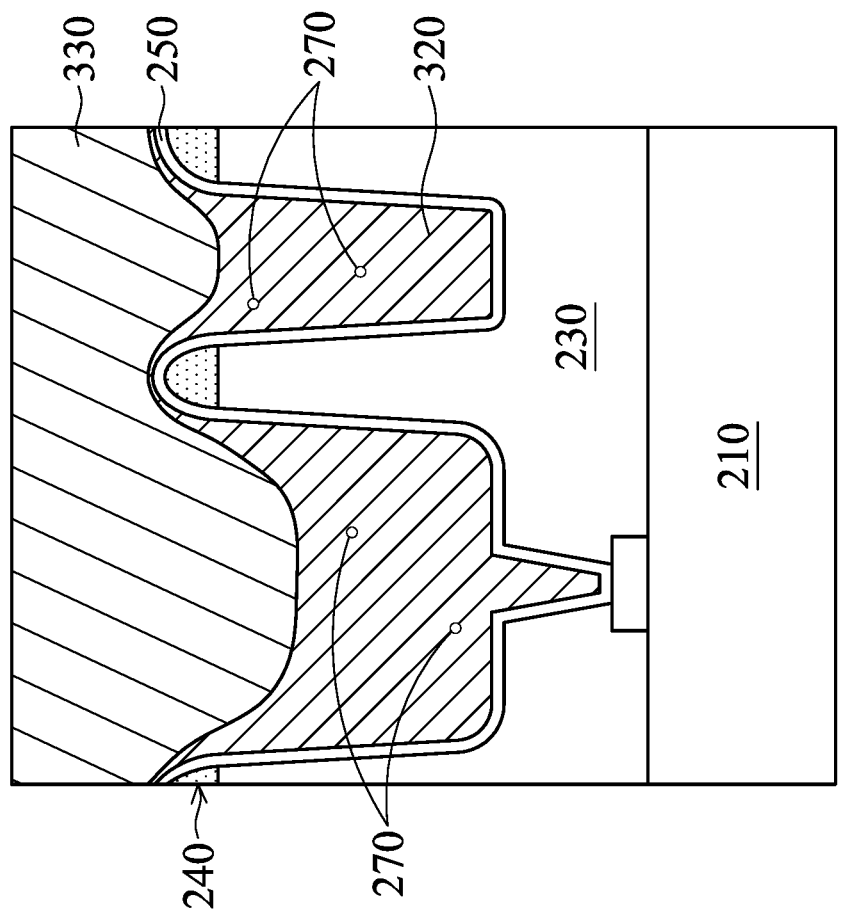

As shown in FIG. 2I, a conductive layer 330 is formed over the thick conductive layer 320, in accordance with some embodiments. The conductive layer 330 includes copper, copper alloys, cobalt (Co), ruthenium (Ru) or other suitable conductive materials, in accordance with some embodiments. In some embodiments, the conductive layer 330 is formed by an electroplating process.

Figures 1, 2J:
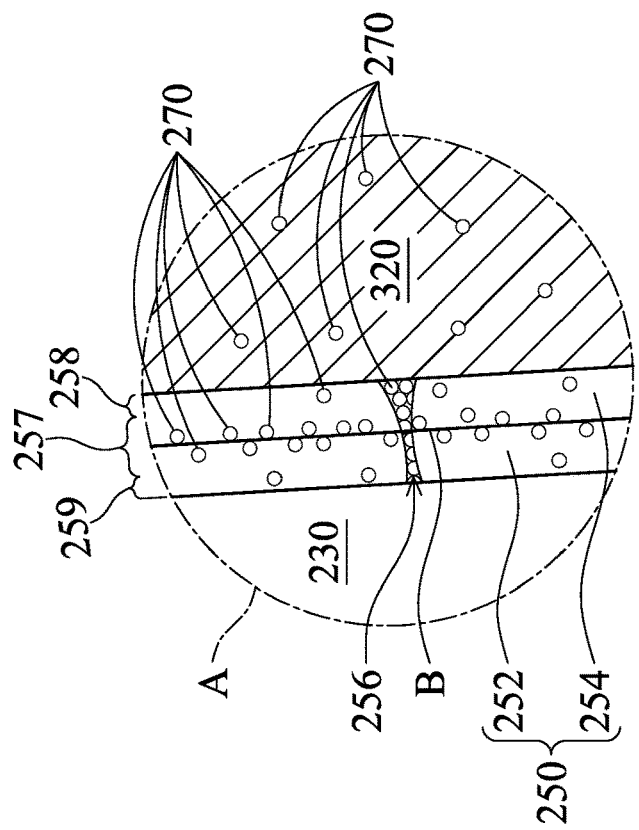
Figure 2J:
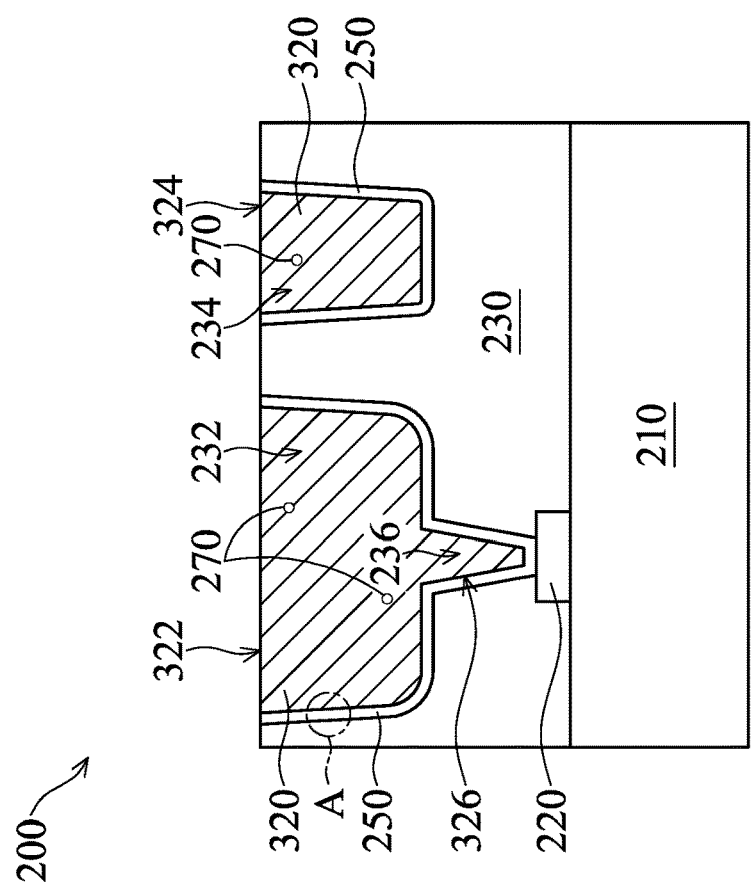

FIG. 2J-1 is an enlarged view of a portion A of the semiconductor device structure of FIG. 2J, in accordance with some embodiments. As shown in FIGS. 2J and 2J-1, the conductive layer 330, the mask layer 240, and upper portions of the thick conductive layer 320, the dielectric layer 230, and the barrier layer 250 are removed, in accordance with some embodiments.

After the removal process, the conductive layer 320 remaining in the trench 232 forms a conductive line 322, and the conductive layer 320 remaining in the trench 234 forms a conductive line 324, in accordance with some embodiments. The removal process includes a planarization process, such as a chemical mechanical polishing process, in accordance with some embodiments.

The barrier layer 250 has a central portion 257 and peripheral portions 258 and 259, in accordance with some embodiments. The peripheral portion 258 is adjacent to the thick conductive layer 320, in accordance with some embodiments. The peripheral portion 259 is adjacent to the dielectric layer 230, in accordance with some embodiments.

The atomic concentration of the manganese 270 in the central portion 257 is greater than the atomic concentration of the manganese 270 in the peripheral portion 258, in accordance with some embodiments. The atomic concentration of the manganese 270 in the central portion 257 is greater than the atomic concentration of the manganese 270 in the peripheral portion 259, in accordance with some embodiments.

The boundary B between the layers 252 and 254 is in the central portion 257, in accordance with some embodiments.

In this step, a semiconductor device structure 200 is substantially formed, in accordance with some embodiments.

Processes and materials for forming the semiconductor device structure 200 may be similar to, or the same as, those for forming the semiconductor device structure 100 described above. Elements designated by the same or similar reference numbers as those in FIGS. 1A to 2J have the same or similar structures and the materials. Therefore, the detailed descriptions thereof will not be repeated herein.

In accordance with some embodiments, semiconductor device structures and methods for forming the same are provided. The methods (for forming the semiconductor device structure) anneal a seed layer in a high concentration of a hydrogen gas, and therefore manganese in the seed layer diffuses to a barrier layer, which improves the barrier ability of the barrier layer. The barrier layer is configured to block the diffusion of metal atoms of a conductive layer formed on the barrier layer. Therefore, the reliability of the semiconductor device structures with the barrier layer is improved.

In accordance with some embodiments, a method for forming a semiconductor device structure is provided. The method includes removing a portion of a dielectric layer to form a trench in the dielectric layer. The method includes forming a barrier layer in the trench. The method includes forming a seed layer in the trench and over the barrier layer. The seed layer is doped with manganese. The method includes annealing the seed layer in a first process gas including a first hydrogen gas. A volume ratio of the first hydrogen gas to the first process gas ranges from about 50% to about 100%, and the manganese diffuses from the seed layer to the barrier layer during the annealing of the seed layer in the first process gas.

In accordance with some embodiments, a method for forming a semiconductor device structure is provided. The method includes forming a trench in a dielectric layer. The method includes depositing a barrier layer in the trench. The method includes forming a first seed layer in the trench and over the barrier layer. The first seed layer is doped with manganese. The method includes forming a second seed layer over the first seed layer. The second seed layer is doped with manganese. The method includes annealing the first seed layer and the second seed layer in a first process gas including a first hydrogen gas to fuse the first seed layer with the second seed layer so as to form a thick seed layer. A volume ratio of the first hydrogen gas to the first process gas ranges from about 50% to about 100%, and the manganese diffuses from the first seed layer and the second seed layer to the barrier layer during the annealing of the first seed layer and the second seed layer in the first process gas.

In accordance with some embodiments, a semiconductor device structure is provided. The semiconductor device structure includes a dielectric layer. The semiconductor device structure includes a barrier layer in the dielectric layer. The barrier layer is doped with manganese, the barrier layer has a central portion and a first peripheral portion, the first peripheral portion is between the dielectric layer and the central portion, and a first concentration of the manganese in the central portion is greater than a second concentration of the manganese in the first peripheral portion. The semiconductor device structure includes a conductive layer in the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   removing a portion of a dielectric layer to form a trench in the dielectric layer;
   forming a barrier layer in the trench;
   forming a seed layer in the trench and over the barrier layer, wherein the seed layer is doped with manganese; and
   annealing the seed layer in a first process gas comprising a first hydrogen gas, wherein a volume ratio of the first hydrogen gas to the first process gas ranges from about 50% to about 100%, and the manganese diffuses from the seed layer to the barrier layer during the annealing of the seed layer in the first process gas.

2. The method for forming the semiconductor device structure as claimed in claim 1, wherein a first concentration of the manganese in the barrier layer is greater than a second concentration of the manganese in the seed layer after the manganese diffuses from the seed layer to the barrier layer.

3. The method for forming the semiconductor device structure as claimed in claim 1, wherein the volume ratio of the first hydrogen gas to the first process gas ranges from about 60% to about 100%.

4. The method for forming the semiconductor device structure as claimed in claim 1, wherein the first process gas further comprises nitrogen or an inert gas.

5. The method for forming the semiconductor device structure as claimed in claim 1, wherein an upper portion of the seed layer flows downwardly during the annealing of the seed layer in the first process gas.

6. The method for forming the semiconductor device structure as claimed in claim 1, wherein a first concentration of the manganese in a central portion of the barrier layer is greater than a second concentration of the manganese in a peripheral portion of the barrier layer after the manganese diffuses from the seed layer to the barrier layer.

7. The method for forming the semiconductor device structure as claimed in claim 1, wherein the barrier layer has a hole, and the manganese diffuses from the seed layer into the hole after the annealing of the seed layer in the first process gas.

8. The method for forming the semiconductor device structure as claimed in claim 7, wherein a first concentration of the manganese in the hole is greater than a second concentration of the manganese in the barrier layer.

9. The method for forming the semiconductor device structure as claimed in claim 1, further comprising:
   depositing a conductive layer over the seed layer after the annealing of the seed layer in the first process gas; and
   annealing the conductive layer, wherein an upper portion of the conductive layer flows downwardly during the annealing of the conductive layer.

10. The method for forming the semiconductor device structure as claimed in claim 9, wherein the annealing of the conductive layer is performed in a second process gas comprising a second hydrogen gas, and a volume ratio of the second hydrogen gas to the second process gas ranges from about 50% to about 100%.

11. A method for forming a semiconductor device structure, comprising:
    forming a trench in a dielectric layer;
    depositing a barrier layer in the trench;
    forming a first seed layer in the trench and over the barrier layer, wherein the first seed layer is doped with manganese;
    forming a second seed layer over the first seed layer, wherein the second seed layer is doped with manganese; and
    annealing the first seed layer and the second seed layer in a first process gas comprising a first hydrogen gas to fuse the first seed layer with the second seed layer so as to form a thick seed layer, wherein a volume ratio of the first hydrogen gas to the first process gas ranges from about 50% to about 100%, and the manganese diffuses from the first seed layer and the second seed layer to the barrier layer during the annealing of the first seed layer and the second seed layer in the first process gas.

12. The method for forming the semiconductor device structure as claimed in claim 11, wherein the depositing of the barrier layer comprises:
    depositing a first layer in the trench of the dielectric layer; and
    depositing a second layer over the first layer, wherein the first layer and the second layer are made of different materials.

13. The method for forming the semiconductor device structure as claimed in claim 12, wherein the first layer has a first portion and a second portion, the first portion is adjacent to the second layer, the second portion is adjacent to the dielectric layer, and a first concentration of the manganese in the first portion is greater than a second concentration of the manganese in the second portion after annealing the first seed layer and the second seed layer.

14. The method for forming the semiconductor device structure as claimed in claim 12, wherein the second layer has a first portion and a second portion, the first portion is adjacent to the first layer, the second portion is adjacent to the thick seed layer, and a first concentration of the manganese in the first portion is greater than a second concentration of the manganese in the second portion after annealing the first seed layer and the second seed layer.

15. The method for forming the semiconductor device structure as claimed in claim 11, wherein the barrier layer has a hole, and the manganese diffuses from the first seed layer and the second seed layer into the hole.

16. A method for forming a semiconductor device structure, comprising:
    removing a portion of a dielectric layer to form a trench in the dielectric layer;
    forming a barrier layer in the trench;
    forming a seed layer in the trench and over the barrier layer, wherein the seed layer is doped with manganese; and
    annealing the seed layer in a process gas comprising a hydrogen gas, wherein the barrier layer has a hole, and the manganese diffuses from the seed layer into the hole of the barrier layer during the annealing of the seed layer in the process gas.

17. The method for forming the semiconductor device structure as claimed in claim 16, wherein the hole passes through the barrier layer.

18. The method for forming the semiconductor device structure as claimed in claim 16, wherein a first concentration of the manganese in the hole is greater than a second concentration of the manganese in the barrier layer after the seed layer is annealed.

19. The method for forming the semiconductor device structure as claimed in claim 18, wherein the barrier layer has a first layer and a second layer over the first layer, and the first layer and the second layer are made of different materials.

20. The method for forming the semiconductor device structure as claimed in claim 19, wherein the first layer has a first portion and a second portion, the second portion is between the first portion and the dielectric layer, the first portion is between the second portion and the second layer, and a first concentration of the manganese in the first portion is greater than a second concentration of the manganese in the second portion after the seed layer is annealed.

\* \* \* \* \*